United States Patent [19]

Oldfield

[11] Patent Number: 5,053,733

[45] Date of Patent: Oct. 1, 1991

[54] METHOD AND APPARATUS FOR MULTIPLEXING BROAD BAND HIGH FREQUENCY SIGNALS FOR USE IN NETWORK ANALYZERS

[75] Inventor: William W. Oldfield, Redwood City, Calif.

[73] Assignee: Wiltron Company, Morgan Hill, Calif.

[21] Appl. No.: 419,340

[22] Filed: Oct. 10, 1989

Related U.S. Application Data

[63]* Continuation-in-part of Ser. No. 294,882, Jan. 9, 1989, and a continuation-in-part of Ser. No. 378,012, Jul. 11, 1989.

[51] Int. Cl.[5] .............................................. H03H 7/46
[52] U.S. Cl. .................................... 333/110; 333/116; 333/132; 333/134; 370/123
[58] Field of Search ............... 333/109, 110, 115, 116, 333/117, 126, 129, 132, 134; 370/57, 123

[56] References Cited

U.S. PATENT DOCUMENTS

| | | | |
|---|---|---|---|
| 4,061,990 | 12/1977 | Veno | 333/110 |
| 4,287,605 | 9/1981 | Dydyk | 333/110 X |
| 4,376,921 | 3/1983 | Dickens et al. | 333/116 |
| 4,418,430 | 11/1983 | Halderman | 333/110 X |
| 4,605,902 | 8/1986 | Harrington | 333/109 X |
| 4,808,913 | 2/1989 | Grace | 333/109 X |

Primary Examiner—Eugene R. LaRoche
Assistant Examiner—Benny Lee
Attorney, Agent, or Firm—Fliesler, Dubb, Meyer & Lovejoy

[57] ABSTRACT

A method and apparatus for multiplexing broad band high frequency signals using either a parallel line contra-directional microwave coupler or forward coupling microwave coupler. A first source of signals comprising multiple decades of frequencies below a first frequency is connected to the through-arm of the coupler and a second source of signals comprising a higher band of frequencies is connected to the coupling arm of the coupler. By using a coupler designed for operation at the frequencies of the signals from the second source, the loss of signal strength from the second source is significantly reduced while the loss of signal strength from the first source is only slightly greater than that incurred in prior known microwave multiplexers.

32 Claims, 7 Drawing Sheets

5,053,733

METHOD AND APPARATUS FOR MULTIPLEXING BROAD BAND HIGH FREQUENCY SIGNALS FOR USE IN NETWORK ANALYZERS

CROSS-REFERENCE TO RELATED APPLICATIONS

This is a continuation-in-part of U.S. Pat. application Ser. No. 07/294,882, filed Jan. 9, 1989 and U.S. Pat. application Ser. No. 07/378,012, filed July 11, 1989, both assigned to the assignee of the present application.

BACKGROUND OF THE INVENTION

1. Field of the Invention

The present invention relates to a method and apparatus for multiplexing broad band high frequency signals in general and in particular to a method and apparatus for multiplexing broad band high frequency signals in a network analyzer or other system comprising a signal generator for generating broad band high frequency signals.

2. Description of the Prior Art

A network analyzer is an apparatus used for analyzing the electrical characteristics and performance of electrical networks and components thereof at various frequencies. In the analyzer, a network or component being analyzed is called a device under test or DUT. The signals transmitted through the DUT and/or reflected from the DUT are measured against a reference signal. The resulting ratios, i.e. S parameters, are a measure of the DUT's performance over the frequency range(s) of the signals applied thereto. The frequencies applied to a DUT may range from DC to over 60 gigaHertz (60 GHz) depending on the type of network or component being analyzed.

To facilitate the testing of broad band devices, signals over a wide range of frequencies are typically generated by means of a plurality of signal generators, each of which provides a signal having a predetermined range of frequencies, e.g. 0.01-8 GHz, 8-20 GHz, 20-26 GHz, 26-40 GHz, 40-60 GHz, etc. When a plurality of such signal generators is used, the outputs of the signal generators are multiplexed, i.e. combined. Heretofore, it has been the practice to combine the outputs of the signal generators by means of a resistor network or some type of multithrow switch, e.g. an electro-mechanical or an electronic (PIN or FET) diode switch. However, each of these means has certain advantages and disadvantages.

An electro-mechanical switch has the advantage of producing low losses at high frequencies, but has the disadvantage of having a limited switching life and, therefore, is undesirable in a network analyzer requiring frequent switching between multiple frequency ranges. Electronic switches, on the other hand, have unlimited switching life, but have large insertion losses, e.g. 7-8 dB, at higher frequencies, e.g. 40 GHz and above. Since the output power of a signal generator at such high frequencies is typically quite low, the use of electronic switches at such frequencies is also undesirable.

SUMMARY OF THE INVENTION

In view of the foregoing, principal objects of the present invention are a method and apparatus for multiplexing broad band high frequency signals, e.g. 0.01-60 GHz using a parallel line coupler, i.e. either a single section contra-directional microwave coupler or a forward coupling coupler.

A single section contra-directional microwave coupler is typically thought of as a narrow band device in that it is designed for coupling a predetermined amount of energy within a predetermined frequency band from a through-arm to a coupled arm. The magnitude of the coupling depends on the construction of the device. For example, in one such device, known as a hybrid coupler, the maximum loss of signal strength through either the through-arm or the coupling arm in the frequency range for which the device is built, in addition to normal insertion loss, is approximately 3 dB. In another such coupler, which is not considered a hybrid, the loss of signal strength through the through-arm and the coupling arm in the frequency range for which the device is built, in addition to normal insertion loss, is approximately 6 dB and 1.5 dB, respectively.

While the conventional microwave coupler is typically thought of as a narrow band device, it is in fact a narrow band device only with respect to signals passing through its coupling arm. With respect to signals passing through its through-arm, the device may be considered a broad band device. This is because the loss of signal strength or signal attenuation with respect to signals passing through the through-arm of the device decreases with decreasing frequency, approaching 0 dB as the frequency decreases toward DC.

The broad band characteristics of the through-arm and the limited losses in the coupling arm as described above are used to advantage in embodiments of the present invention.

In a first embodiment of the present invention there is provided a plurality of signal sources. The sources providing a broad band of signals, e.g. multi-decades of frequency, below a predetermined frequency, i.e. 40 GHz are selectively coupled to the through-arm of a conventional hybrid parallel line contra-directional microwave coupler by means of a PIN diode switch or the like. A source providing signals above said predetermined frequency, e.g. 40-60 GHz is coupled to the coupling arm. In this embodiment, the coupler is designed for use in the 40-60 GHz band.

By using a 40-60 GHz coupler in the manner described, it is found that, relative to prior art combining techniques, there is a slight increase in the loss of signal strength below 40 GHz, i.e. 3 dB at 40 GHz and lesser values at lower frequencies. In contrast, above 40 GHz it is found that, relative to prior art combining techniques, the use of the coupler significantly improves signal strength by restricting losses to 3 dB. That is, the maximum loss in signal strength at the output of the coupler, in addition to normal insertion losses, never exceeds 3 dB over the entire band of 0.01-60 GHz.

In another embodiment of the present invention a plurality of 40-60 GHz couplers are used in a network analyzer for multiplexing signals having frequencies in the range 0.01-40 GHz and the range 40-60 GHz. In this embodiment, the couplers are used for providing either 0.01-40 GHz signals or 40-60 GHz signals simultaneously at both a test signal port and a reference signal port. By using the couplers to take advantage of the broad band characteristics of their through-arms and the limited losses in their coupling arms, a significant increase in available signal strength at the output of the coupler is achieved over the entire 0.01-60 GHz range.

In still other embodiments of the present invention, the parallel line, contra-directional couplers used in the embodiments described above are replaced by a parallel line forward coupling coupler described in detail in applicant's copending U.S. patent application entitled MICROWAVE COUPLER AND METHOD OF OPERATING SAME UTILIZING FORWARD COUPLING, U.S. patent application Ser. No. 07/378,012, filed July 11, 1989.

Like the contra-directional coupler described above, the forward coupling coupler comprises a through-arm having an input port and an output port and a coupling arm having an adjacent port and an opposite port. The terms through-arm and input port are used to identify the arm and port to which an input signal is applied. The terms adjacent port and opposite port are used to define the position of the ports on the arm to which the signal is coupled relative to the input port. In a contra-directional coupler energy applied to the input port is preferentially coupled to the adjacent port. However, in a forward coupling coupler energy applied to the input port is preferentially coupled to the opposite port.

In using the forward coupling coupler in accordance with the present invention, it was found that significantly improved performance was obtained, particularly at higher frequencies, e.g. above 40 GHz. As in the case of the contra-directional coupler, the lower multi-decade frequency signals, e.g. those below 40 GHz, are applied to the through-arm to take advantage of the broad band characteristics of the through-arm; and the higher frequency signals, e.g. those above 40 GHz, are applied to the coupling arm. In the multiplexing embodiments, the term through-arm is defined as the arm to which a DUT or measuring device is connected and the coupled arm is defined as the arm which is terminated, as by a resistor to ground. With this arrangement it is found that the attenuation of signal strength of signals at the output of the coupler which are coupled through the coupling arm decreases with increasing frequency, approaching −1 dB at 60 GHz.

BRIEF DESCRIPTION OF THE DRAWINGS

The above and other objects, features and advantages of the present invention will become apparent from the following detailed description of the accompanying drawings, in which.

DETAILED DESCRIPTION OF THE INVENTION

Figure 1:
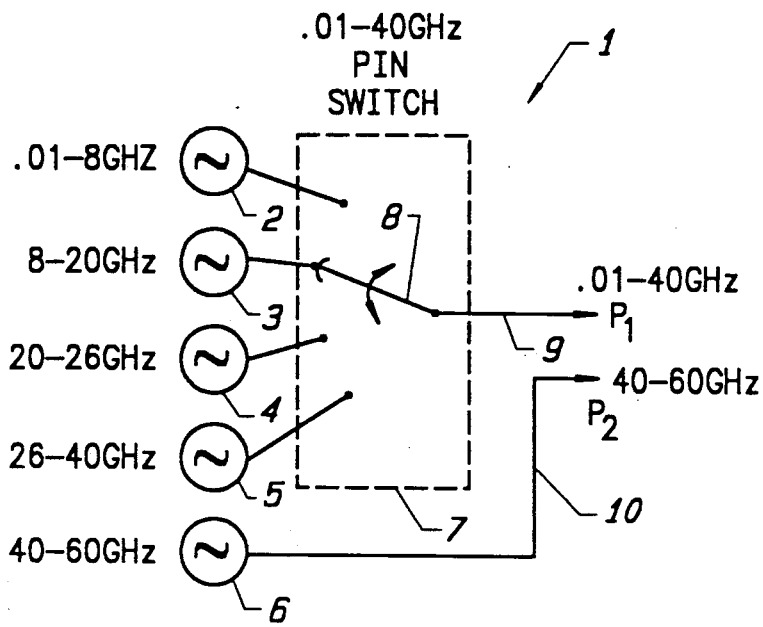
FIG. 1 is a block diagram of a prior known apparatus showing the use of a PIN diode switch for multiplexing the outputs of a plurality of signal sources and the use of a separate source for providing a first signal having a frequency of 0.01–40 GHz and a second signal having a frequency of 40–60 GHz, respectively.
Figure 2:
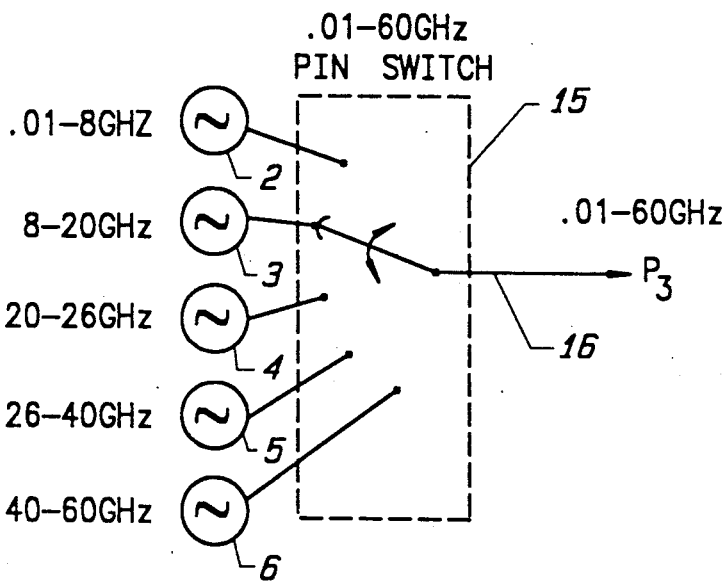
FIG. 2 is a block diagram of a prior known apparatus showing all of the signal sources of FIG. 1 being multiplexed by means of a PIN diode switch for providing a signal having a frequency range of 0.01–60 GHz.
Figure 3:
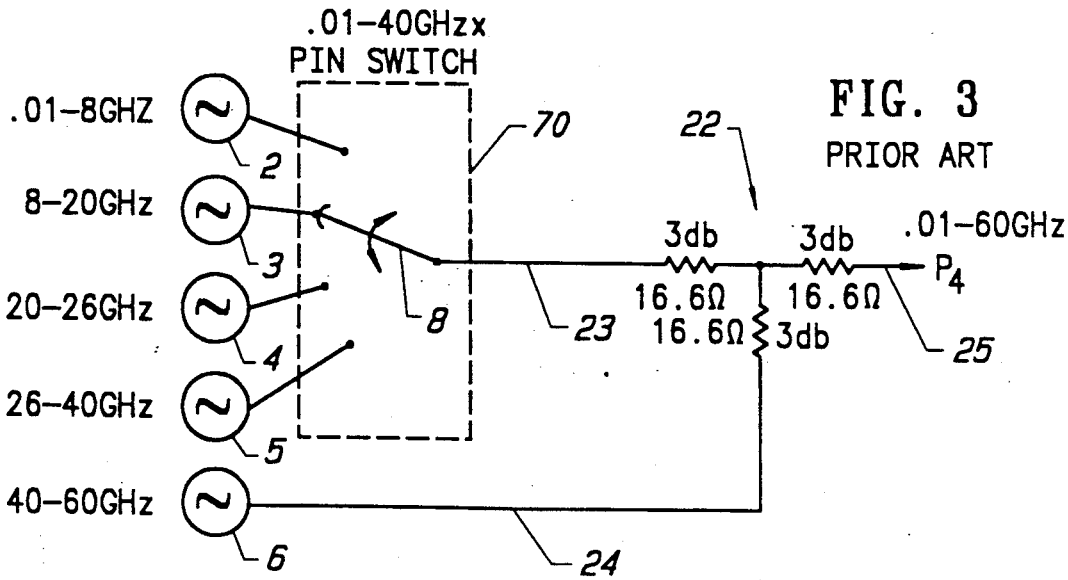
FIG. 3 is a block diagram of a prior known apparatus wherein signals having a frequency of 0.01–40 GHz are multiplexed with a signal having a frequency of 40–60 GHz using a resistor network.

Referring to FIGS. 1, 2 and 3, there are shown three different prior known circuits for multiplexing a plurality of signals to provide an output signal having a multi-decade frequency range of 0.01–60 GHz. In FIG. 1, there is provided a circuit designated generally as 1. In the circuit 1 there is provided a plurality of signal sources 2, 3, 4, 5 and 6. Signal source 2 provides a signal having a frequency range of 0.01–8 GHz. Source 3 provides a signal having a frequency range of 8–20 GHz. Source 4 provides a signal having a frequency range of 20–26 GHz. Source 5 provides a signal having a frequency range of 26–40 GHz. Source 6 provides a signal having a frequency range of 40–60 GHz. Signals from sources 2–5 are multiplexed by means of a conventional electronic PIN diode switch 7. For purposes of explanation, the PIN diode switch 7 is shown as having a movable arm or pole 8 for selectively connecting one of the sources 2–5 to an output connected to a line 9 for providing a signal P1 having a frequency range of 0.01–40 GHz. Coupled to the output of the source 6 there is provided a line 10 for providing a signal P2 having a frequency range of 40–60 GHz. Because the signals P1 and P2 are not provided on a single line, it would be necessary in practice to manually connect the lines 9 and 10 to a device in order to use the signals over the entire frequency range of 0.01–60 GHz in the device.

Figure 6:
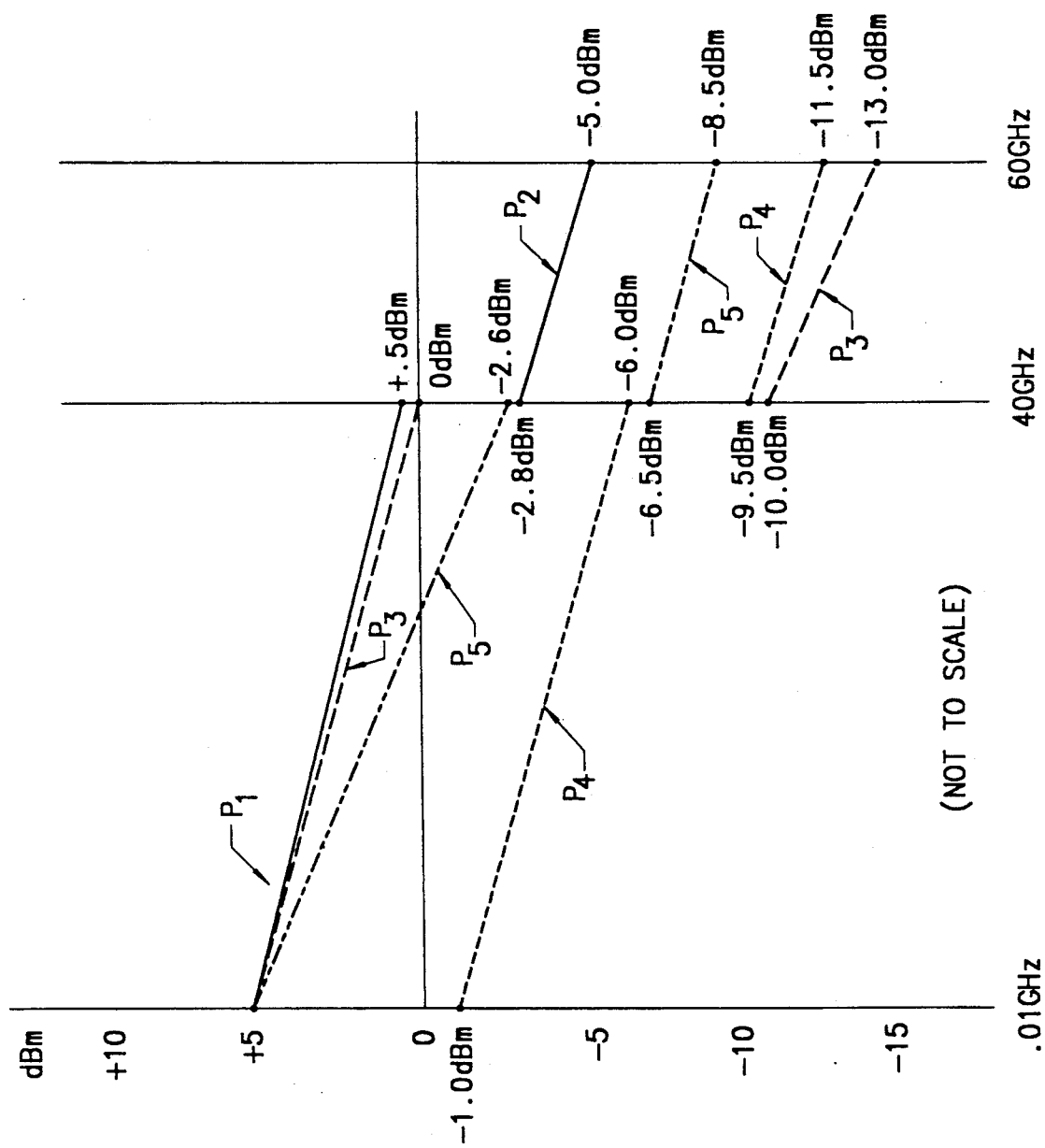
FIG. 6 is a chart of output power levels for the circuits of FIGS. 1–4.

Referring to FIG. 6, there is shown a diagram of the signal strength of the signals P1 and P2 for the frequencies 0.01–40 GHz and 40–60 GHz, respectively. As shown in FIG. 6, the insertion loss of the PIN diode switch 7 increases with increasing frequency such that the signal level of signal P1 decreases by approximately 4.5 dB from 0.01 GHz. From 40-60 GHz, the signal strength P2 decreases from approximately −3 dBm to −5 dBm. This is partially due to the fact that the power output of an oscillator typically decreases with increasing frequency.

Referring to FIG. 2, the signal sources 2-6 described above with respect to FIG. 1 are multiplexed using conventional PIN diode switch multiplexing techniques including a modified PIN diode switch designated generally as 15. By including the source 6 in the PIN diode switch 15, one is able to provide on an output line 16 a signal P3 having a frequency range of 0.01-60 GHz thereby eliminating the need for manually connecting the sources as described above with respect to FIG. 1. However as will be noted, the addition of source 6 to the PIN diode switch 15 increases the insertion loss of the PIN diode switch 15, as shown more clearly in FIG. 6.

Referring to FIG. 6, it will be seen that the signal strength of the signal P3 over the frequency range 0.01-40 GHz is approximately 0.5 dB lower than the signal P1 of the apparatus of FIG. 1. More dramatically, the signal strength of the signal P3 over the frequency range 40-60 GHz is substantially lower than the signal P2. As seen in FIG. 6, when the PIN switch 15 couples the source 6 to the line 16, there is an immediate loss of signal strength of approximately 7.4 dB which increases to 8 dB at 60 GHz.

Referring to FIG. 3, there is shown still another method for multiplexing a plurality of signals. Using the same signal sources 2, 3, 4, 5 and 6 described above with respect to FIGS. 1 and 2, sources 2-5 are multiplexed using the 0.01-40 GHz PIN diode switch 7. The pole 8 of diode switch 7 is coupled to a first leg of a three-leg resistor network 22 by means of a line 23. The source 6 is coupled to a second leg of the resistor network 22 by means of a line 24. An output signal P4 having a frequency range of 0.01-60 GHz is provided on a line 25 extending from a third leg of the resistor network 22. Each of the legs in the resistor network 22 comprises a 16.6 ohm resistor providing a 3 dB attenuation for signals passing therethrough.

Referring to FIG. 6, it will be seen that the signal P4 has a level of approximately −1.0 dBm at 0.01 GHz and decreases to −6 dBm at 40 GHz. From 40-60 GHz the signal level of signal P4 decreases from approximately −9.5 dBm to approximately −11.5 dBm.

Figure 4:
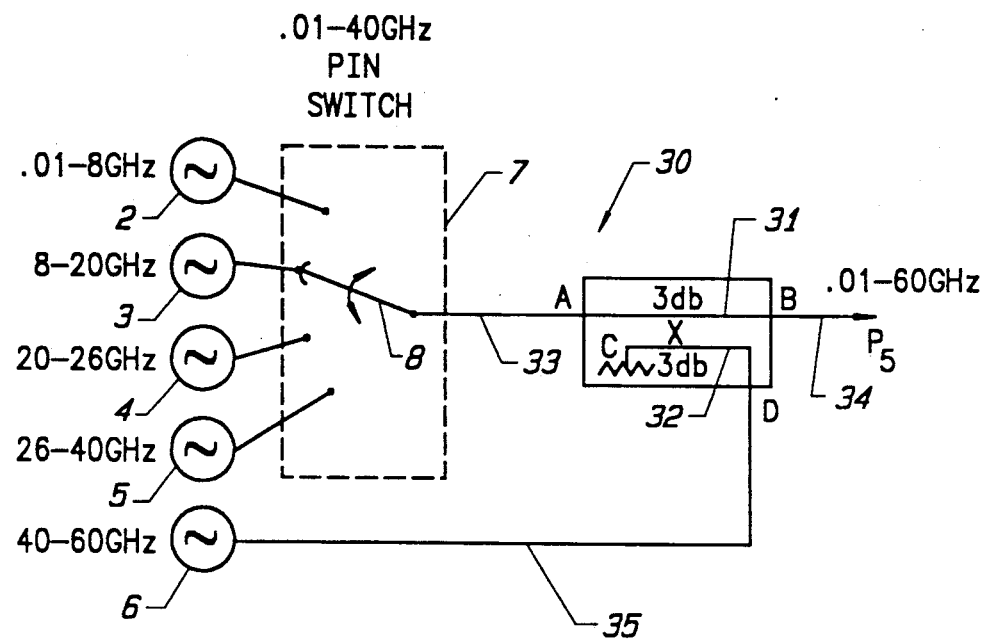
FIG. 4 comprises an embodiment of the present invention wherein signals having a frequency of 0.01–40 GHz are multiplexed with signals having a frequency of 40–60 GHz using a conventional contra-directional microwave coupler.
Figure 5:
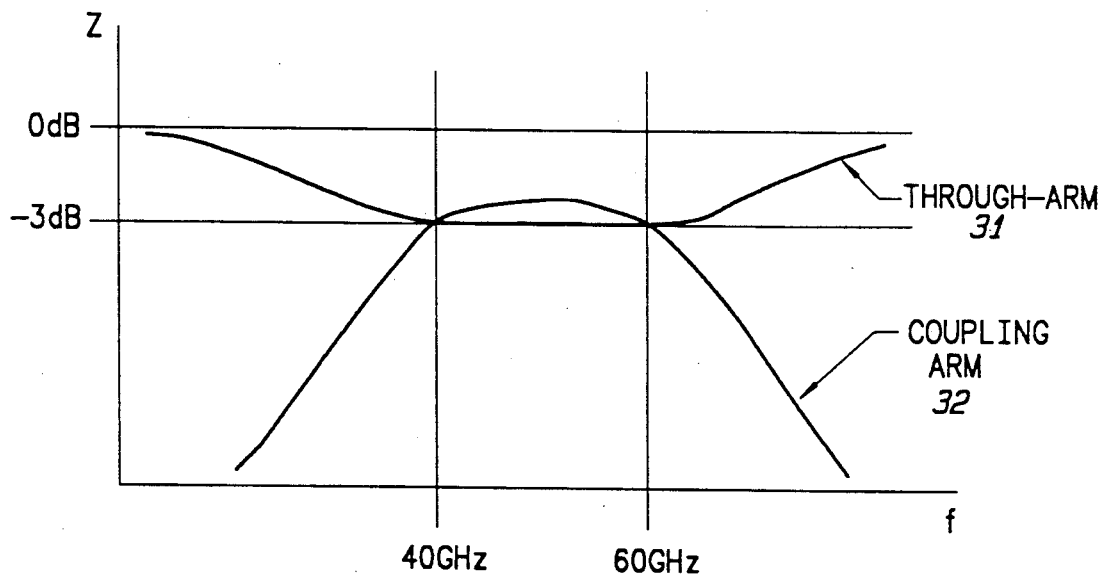
FIG. 5 is a drawing representing coupling (z) vs. frequency (f) of the through-arm and coupling arm signal paths, of the coupler of FIG. 4.

Referring to FIGS. 4 and 5, there is provided in accordance with the present invention an apparatus for multiplexing the signals from the sources 2, 3, 4, 5 and 6 using the 0.01-40 GHz PIN diode switch 7 of FIGS. 1 and 3 and a conventional microwave single section contra-directional hybrid coupler designated generally as 30. In the coupler 30 there is provided a through-arm 31 having a port A and a port B and a coupling arm 32 having a port C and a port D. The port C is terminated internally by a suitable resistor coupled to ground in a known manner. The port A of through-arm 31 is coupled to the switch 7 by means of a line 33 and the port B is coupled to the line 34 for providing a signal P5 having a frequency range of 0.01-60 GHz. Port D of the coupling arm 32 is coupled to the source 6 by means of a line 35.

Referring to FIG. 5, over the frequency band of 40-60 GHz, the maximum attenuation of coupler 30, in addition to normal insertion losses, is approximately 3 dB. Contra-directional microwave couplers such as coupler 30 are typically thought of as narrow band devices in that they are designed to operate over a particular band of frequencies, e.g. 40-60 GHz. On close inspection, however, it will be noticed that the narrow band characteristics of the coupler 30 are actually restricted to the signals passing through the coupling arm 32 to the arm 31 from the port D to the adjacent port B. In contrast, the attenuation of the signals passing through the through-arm 31 from the port A to the port B actually decreases with decreasing frequency.

Referring to FIG. 6, it will be seen that the strength of the signal P5 decreases somewhat more rapidly than the signal strength of signals P1 and P3 of the embodiment of FIGS. 1 and 2 over the range of frequencies 0.01-40 GHz. In contrast, the signal strength of P5 is considerably greater than the signal strength of signals P3 and P4 over the range of frequencies 40-60 GHz. That is to say, in exchange for a slightly greater loss of signal strength over the frequency range 0.01-40 GHz, the apparatus of the present invention provides a considerably signal strength over the range of 40-60 GHz, as shown by the signal level P5 of FIG. 6.

Figure 7:
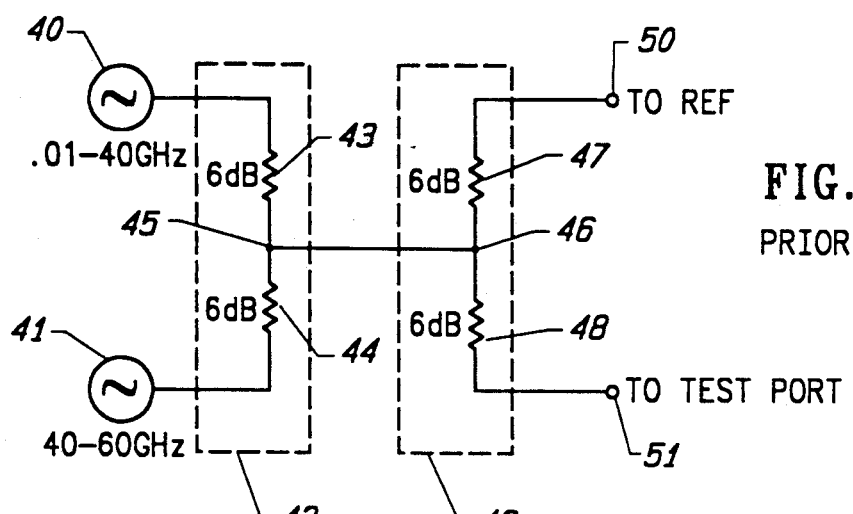
FIG. 7 is a typical prior known resistor circuit used for providing 0.01–40 GHz signals and 40–60 GHz signals to a reference signal port and to a test signal port in a network analyzer.

Referring to FIG. 7, there is provided a pair of signal sources 40 and 41. Source 40 provides a signal having a frequency range of 0.01-40 GHz. Source 41 provides a signal having a frequency range of 40-60 GHz. Sources 40 and 41 are coupled to a prior known resistive signal combiner 42 comprising a pair of resistors 43 and 44. A node 45 between the resistors 43 and 44 is coupled to a node 46 located between a comparable set of resistors 47 and 48 in a prior known power splitter designated generally as 49. The resistor 47 is coupled to a reference signal port 50. Resistor 48 is coupled to a test signal port 51.

In operation, signals from either signal source 40 or signal source 41 are applied to reference signal port 50 and test signal port 51 by means of the combiner 42 and splitter 49. As shown by the 6 dB designations adjacent each of the resistors 43, 44, 47 and 48, there is a significant loss of signal between the sources 40 and 41 and the reference signal port 50 and test signal port 51 using the combiner 42 and splitter 49.

Figure 8:
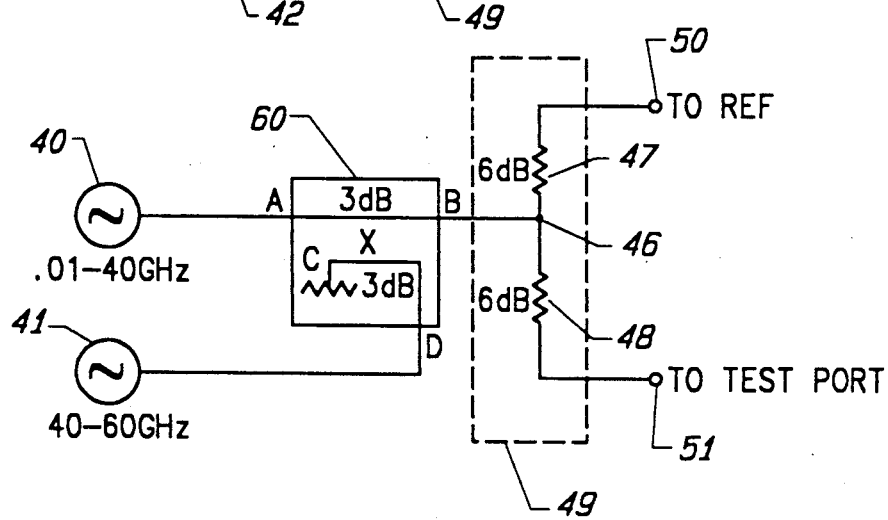
FIG. 8 is an embodiment of the present invention in which a 0.01–40 GHz signal and a 40–60 GHz multiplexed by means of a contra-directional microwave coupler to provide a 0.01–40 GHz signal and a 40–60 GHz signal on a reference signal port and a test signal port in a network analyzer.

Referring to FIG. 8, to reduce the signal loss described above with respect to the apparatus of FIG. 7, the combiner 42 is replaced by means of a hybrid microwave coupler 60 having ports A, B, C and D described above with respect to the couple 30 of FIG. 4. Because the maximum signal loss in combiner 60 is, in addition to a normal insertion loss, limited to 3 dB, the use of the combiner 60 provides an immediate improvement in signal strength over that available in the apparatus of FIG. 7.

Figure 9:
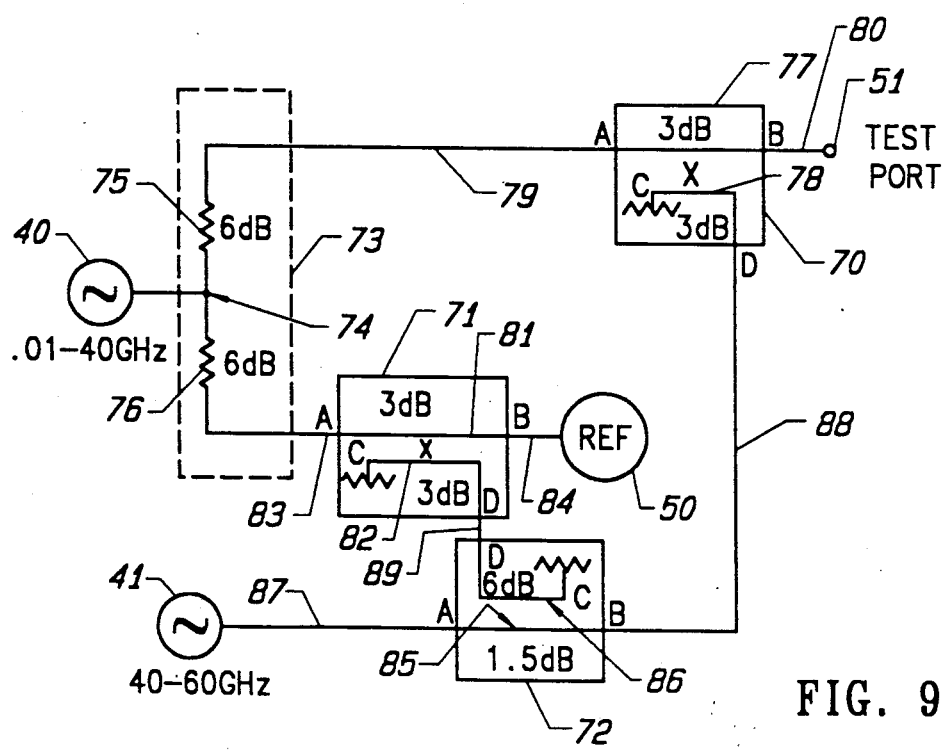
FIG. 9 is another embodiment of the present invention in which a 0.01–40 GHz signal and a 40–60 GHz signal are multiplexed using a plurality of contra-directional microwave couplers for providing a 0.01–40 GHz signal and a 40–60 GHz signal on a test signal port and a reference signal port in a network analzyer.

Referring to FIG. 9, in still another embodiment of the present invention is an apparatus for providing a signal on the test signal port 51 and the reference signal port 50 using a plurality of microwave couplers 70, 71 and 72 and a power splitter 73. The source 40 is coupled to a node 74 located between a pair of resistors 75 and 76 in the splitter 73.

In the first coupler 70 there is provided a through-arm 77 and a coupling arm 78. Port A of through-arm 77 is coupled to the resistor 75 by means of a signal line 79. Port B of the through-arm 77 is coupled to the test signal port 51 by means of a signal line 80. Port C of the coupling arm 78 is terminated internally by a suitable resistor coupled to ground in a known manner.

In the coupler 71 there is provided a through-arm 81 and a coupling arm 82. Port A of the through-arm 81 is coupled to the resistor 76 by means of a signal line 83.

Port B of the through-arm 81 is coupled to the reference signal port 50 by means of a signal line 84. Port C of the coupling arm 82 is terminated internally by a suitable resistor coupled to ground in a known manner.

In coupler 72 there is provided a through-arm 85 and a coupling arm 86. Port A of the through-arm 85 is coupled to the source 41 by means of a signal line 87. Port B of the through-arm 85 is coupled to port D of the coupling arm 78 in the coupler 70 by means of a signal line 88. Port C of the coupling arm 82 is terminated internally by a suitable resistor coupled to ground in a known manner. Port D of the coupling arm 86 in the coupler 72 is coupled to port D of the coupling arm 82 in the coupler 71 by means of a signal line 89.

The couplers 70 and 71 are conventional single section contra-directional hybrid couplers providing a 3 dB loss of signal with respect to signals passing through the coupler via either the through-arm 77, 81 or the coupling arm 78, 82. Coupler 72, on the other hand, is not considered to be a hybrid coupler and has a 6 dB attenuation with respect to signals passing through the coupling arm and a 1.5 dB attenuation with respect to signals passing through the through-arm 85. The 6 dB attenuation was chosen to provide a reasonably strong signal to the reference signal port and simultaneously have as small a loss as possible to the test signal port. Other values could also be used.

Recalling that the power output of high frequency signal sources decreases with increasing signal frequency, it is important that the attenuation of the signals from the source 41 be kept at a minimum. This is particularly true with respect to signals from the source 41 at the test signal port 51.

As shown in FIG. 9, there is provided adjacent to each of the arms in the couplers 70, 71 and 72 an indication of the amount of attenuation encountered by signals passing therethrough. For example, a signal passing through the through-arm 77 of the coupler 70 will experience a 3 dB loss in signal level whereas a signal passing through the through-arm 85 in the coupler 72 will experience a 1.5 dB loss in signal level. Similarly, a signal passing through the coupling arm 82 of the coupler 71 will experience a 3 dB loss in signal level whereas a signal passing through the coupling arm 86 of the coupler 72 will experience a 6 dB loss in signal level. Thus, when the source 40 is coupled to the test signal port 51 and the reference signal port 50, the signal levels at each of these ports is reduced by approximately 9 dB. When the source 41 is coupled to the test signal port 50 and the reference signal port 51, the signal levels of the signals transmitted between the source 41 to the reference signal port 50 via the coupling arms 86 and 82 are also reduced by 9 dB. However, in contrast thereto, when the signals from the source 41 are applied to the test signal port 51 they undergo only a 4.5 dB loss in signal strength. This reduced attenuation of the signal more than compensates for the reduced power output of the source 41 at the higher frequencies.

Figure 10:
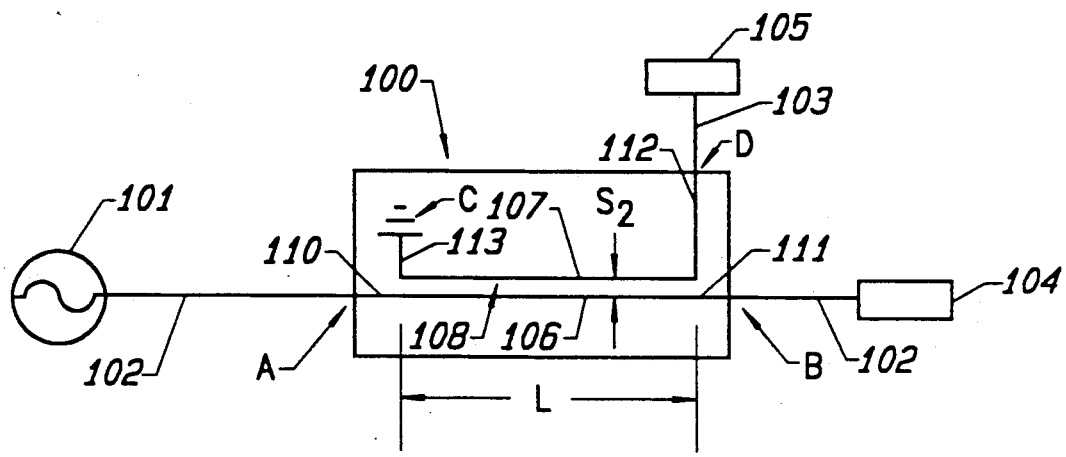
FIG. 10 is a schematic diagram of an apparatus for forward coupling signals comprising a suspended substrate directional forward coupling coupler in accordance with the present invention.
Figure 11:
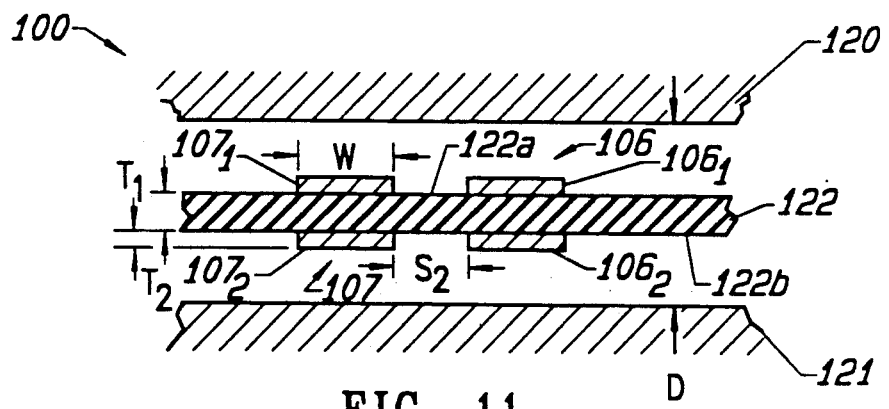
FIG. 11 is a cross-sectional view of a suspended substrate directional forward coupling coupler in accordance with the present invention.

Referring to FIGS. 10 and 11, there is provided for use in other embodiments of the present invention a forward coupling coupler designated generally as 100 which is also described in detail in applicant's above-identified copending application entitled MICROWAVE COUPLER AND METHOD OF OPERATING SAME UTILIZING FORWARD COUPLING.

As seen more clearly in FIG. 11, the coupler 100, also known as a suspended substrate coupler, has a large spacing forming a coupling region 108 between a pair of coupled parallel striplines 106, 107 which provides improved coupling characteristics for signals exceeding 26 GHz when operated in the forward coupling mode. For convenience, stripline 106 is called a through-arm or through stripline and stripline 107 is called a coupled arm or coupled stripline. In particular, signals of 40–60 GHz are forward coupled with an unusually large amount of power being coupled, with good directivity, and with low losses.

The forward coupling mode, as used herein, refers to the coupling of power from a signal input at an input port (e.g., port A) on the through stripline 106 to the opposite port (e.g., port D) of the coupled stripline 107. Alternatively, if port B is the input port, power is coupled to port C, if port C is the input port, power is coupled to port B, or if port D is the input port, power is coupled to port A.

A forward coupler in accordance with the present invention is useful, with improved results, in many of the same applications where conventional contra-directional couplers are used, provided that the appropriate connections and isolation of the ports of the coupler are established.

The operation of the suspended substrate coupler 100 in accordance with the present invention will be described with reference to FIG. 10. A signal source 101 provides microwave signals having frequencies of 26 GHz and higher to a first transmission line 102. First transmission line 102 and a second transmission line 103 are connected to coupler 100, and test/measurement devices 104, 105 are connected to transmission lines 102, 103, respectively. As described above, coupler 100 includes first and second stripline conductors 106, 107 which are coupled in coupling region 108, first stripline 106 being inserted as a portion of first transmission line 102, and second stripline conductor 107 being inserted as a portion of second transmission line 103. Coupling region 108 has a length L, and first and second striplines 106, 107 have a spacing S2 in the coupled region. Thus, signal source 101 is connected to port A (first end 110 of stripline 106), test/measurement device 104 is electrically connected to port B (second end 111 of stripline 106), and test/measurement device 105 is electrically connected to port D (second end 112 of stripline 107). Port C (first end 113 of stripline 107) is connected to ground as per the embodiment illustrated in FIG. 4.

In operation, signal source 101 supplies signals at port A, and a portion of the power input at port A is transmitted by first stripline 106 to port B. In addition, a portion of the power input at port A is coupled from first stripline 106 to second stripline 107. The coupled power appears at port D. A small amount of power also appears at port C; however, coupler 100 has good directivity and the amount of power appearing at port C is negligible, or at least less than the amount of power appearing at port D.

Referring to FIG. 11, the suspended substrate directional coupler 100 in accordance with the present invention includes first and second ground conductive planes 120, 121 and a suspended substrate 122 provided between the ground planes 120, 121. The suspended substrate is a dielectric, for example, alumina. Other dielectrics and the properties of various dielectrics are set forth in "Foundations for Microstrip Circuit Design", T.C. Edwards, John Wiley and Sons, 1981. First and second striplines 106, 107 are provided on the suspended substrate 122 and are each formed of first and second conductors $106_1$, $106_2$, $107_1$, $107_2$ provided on opposed first and second surfaces 122a, 122 of suspended substrate 122.

First and second transmission lines 102, 103 (FIG. 10) are usually coaxial conductors. The ground shields of transmission lines 102, 103 are electrically connected to the first and second ground planes 120, 121 of coupler 100 and the centerline conductors of first and second transmission lines 102, 103 are connected to first and second striplines 106, 107, respectively. First and second conductors $106_1$, $106_2$, $107_1$, $107_2$ of each of the first and second striplines 106, 107 are both connected to the centerline conductor of the respective first and second transmission lines 102, 103, so that striplines $106_1$, $106_2$ are connected in parallel and so that striplines $107_1$, $107_2$ are connected in parallel.

Each of the stripline conductors $106_1$, $106_2$, $107_1$, $107_2$ has a width W and a thickness $T_1$ which are related to provide an impedance of 50 ohms for the striplines $106_1$, $106_2$, $107_1$, $107_2$. The distance $S_2$ between first striplines 106, 107 and between second stripline $106_2$ and $107_1$, $107_2$ ranges from approximately 0.01 to 0.05". This spacing $S_2$ is approximately an order of magnitude larger than the spacing between the first and second parallel striplines in conventional contra-directional couplers. The length of the coupled sections of first and second striplines 106, 107 ranges from approximately 0.1 to 0.5". It is important to note the coupled sections are not required to be multiples of one-quarter wavelengths as in conventional couplers. The thickness $T_2$ of substrate 122 may range from approximately 0.002 to 0.015 inches.

Figure 13:
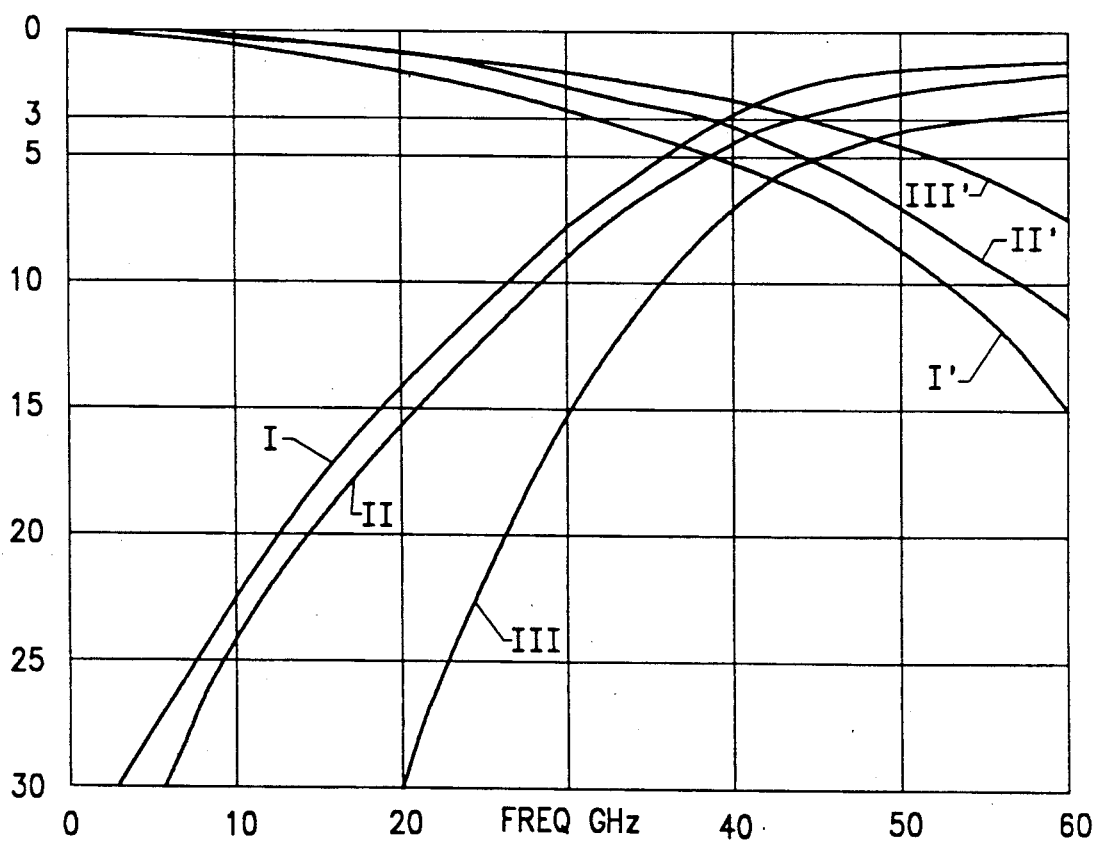

Referring to FIG. 13, a coupler in accordance with the present invention has coupling versus frequency characteristics which are significantly different than those of conventional contra-directional couplers. The coupling for a directional forward coupling coupler in accordance with the present invention becomes tighter as the frequency of the signals increases, without an apparent drop-off in coupling. On the other hand, as shown in FIG. 5, a conventional contra-directional coupler has a bell-shaped coupling curve with the peak of the curve usually falling in the center of the frequency range for which the coupler is designed.

The slope of the coupling versus frequency curve for coupler 100 of the present invention can be controlled by changing the spacing $S_2$ of striplines 106, 107 and the length L of the coupled section of striplines 106, 107. It has been experimentally determined that smaller spacings $S_2$ and shorter coupled section lengths L create a steeper coupling versus frequency curve, making a coupler which is useful for a narrower range of frequencies; however, the tradeoff for a steep coupling versus frequency curve is poorer directivity.

On the other hand, experimental results have determined that a longer coupling length L and a larger coupling spacing $S_2$ yield a coupler having a broader frequency response and a shallower coupling versus frequency curve. Longer coupling lengths L of the coupling region 108 yield improved directivity, but the increased length of striplines 106, 107 increases the losses which occur in coupler 100.

The inventor has determined that a coupler in accordance with the present invention which provides 3 dB coupling at 40 GHz and tighter coupling at higher frequencies (with coupling as tight as 1 dB at 60 GHz) can be fabricated utilizing a coupler having a ground plane spacing D of 0.045", a dielectric having a thickness $T_2$ of 0.005", parallel striplines 106, 107 having a spacing $S_2$ of 0.028", and a coupling region 108 having a length L of 0.35 inches.

Figure 12:
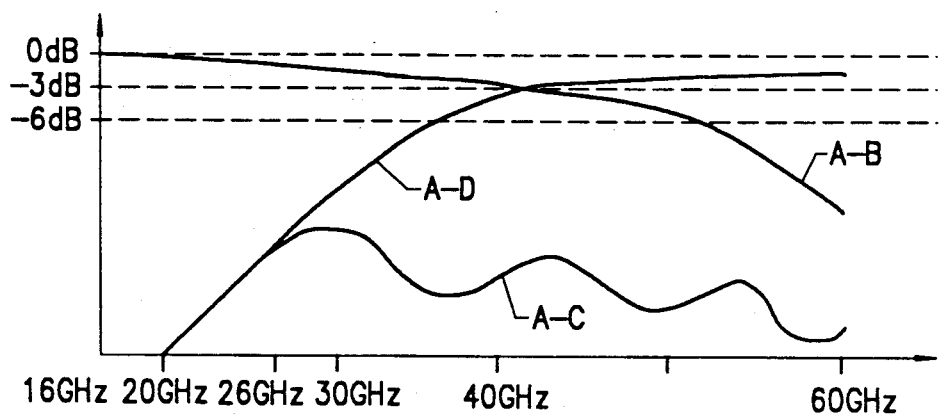
FIGS. 12 and 13 are graphs useful in explaining the operating characteristics of forward coupling couplers in accordance with the present invention.

The coupling versus frequency curve for a coupler having the above dimensions is shown by curve A-D in FIG. 12, which represents the coupling from port A to port D versus frequency. Curve A-B in FIG. 12 shows the losses for a signal transmitted from port A to port B, and curve A-C shows the directivity for this coupler. From FIG. 12 it can be seen that coupling of 3 dB is achieved at 40 GHz, and that tighter coupling is achieved as the frequency of the signal to be coupled increases from 50 to 60 GHz and beyond.

FIG. 13 illustrates coupling characteristics for couplers having a coupling length L of 0.300", spacings $S_2$ of 0.028"(plot I), 0.035"(plot II), and 0.050"(plot III), and a substrate thickness of 0.010". The losses for signals transmitted from port A to port B are illustrated by plots I'-III', respectively.

Figure 14:
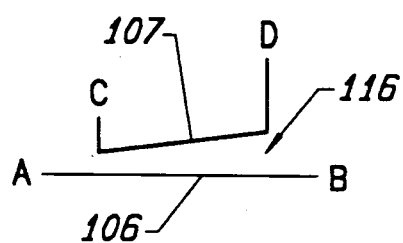
FIGS. 14 and 15 are schematic diagrams of alternative embodiments of forward coupling couplers according to the present invention.
Figure 15:
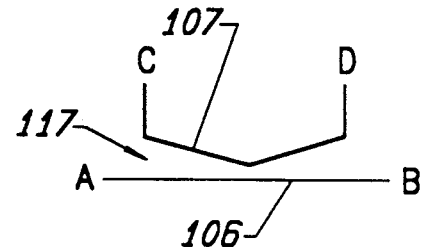

Parallel striplines 106, 107 in the coupling region 108 have been found to provide the best coupling. However, alternative arrangements of first and second striplines 106, 107 in the coupling region 108 have been found to provide satisfactory coupling. Examples of alternative arrangements for striplines 106, 107 are shown in FIGS. 14 and 15. FIG. 14 illustrates a single tapered coupling region 116, and FIG. 15 illustrates a dual tapered coupling region 117. While not technically accurate, such couplers are also thought of as being parallel line couplers.

Figure 16:
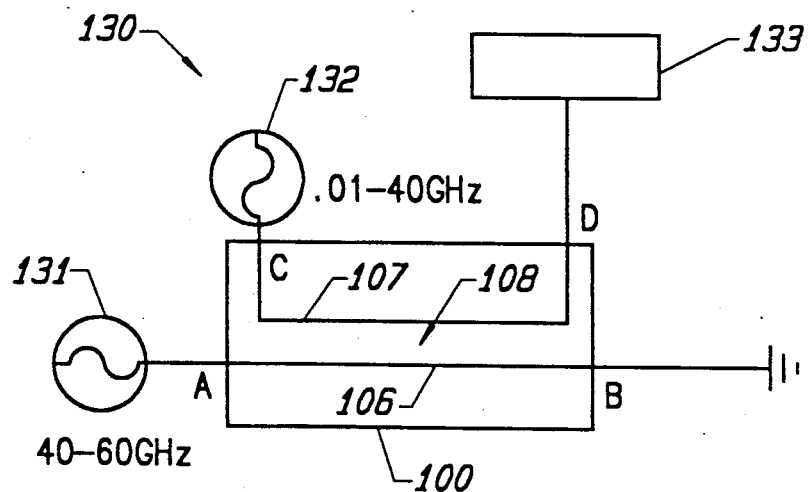
FIG. 16 is a schematic diagram of a multiplexer using a forward coupling coupler according to the present invention.

Referring to FIG. 16, there is provided a multiplexer 130 utilizing the coupler 100 in accordance with the present invention. In multiplexer 130, a signal source 131 provides signals having a frequency ranging from 40 to 60 GHz at port A of coupler 100, and a signal source 132 provides signals having a frequency of 0.01-40 GHz at port C of coupler 100. The $40 \geq 60$ GHz signals applied at port A are coupled to port D, and the 0.01-40 GHz signals applied at port C are transmitted to port D by second stripline 107. Accordingly, signals having frequencies of 1-60 GHz appear at port D and may be detected by test/measurement device 133.

The coupler 100 of the present invention does not appear to operate with odd and even modes as does a conventional contra-directional coupler, and does not appear to operate as a TEM or quasi-TEM mode coupler, based on the fact that the coupling is not contradirectional. It is possible that the coupler operates in a waveguide coupling mode. However, the coupling mechanism is not presently known.

With respect to each of the circuits described above, it will be understood that appropriate controls and terminations (which have been omitted for clarity) are normally provided for controlling each of the signal sources such that the signals from only one source at a time are applied to the couplers in the present invention.

While several embodiments of the present invention are described above, it is contemplated that various modifications may be made thereto without departing from the spirit and scope of the present invention. For example, coupler 72 in FIG. 9 need not be a contradirectional coupler, but can be any other type of coupler designed for coupling signals over a narrow band, e.g. a branch line coupler. Accordingly, it is intended that the embodiments described be considered only as illustrative of the present invention and that the scope thereof should not be limited thereto but be determined by reference to the claims hereinafter provided.

What is claimed is:

1. An apparatus for multiplexing first and second signals having a first and second range of frequencies, respectively, said first range of frequencies comprising multiple decades of frequencies, comprising:
- a microwave coupler, said coupler having first arm and a second arm, said first arm and said second arm each having an input and an output said first arm being operative over a frequency band which substantially extends over said first range of frequencies;
- first means for selectively applying said first signals having said first range of frequencies to said input of said first arm;
- second means for selectively applying said second signals having said second range of frequencies to said input of said second arm; and
- means in said microwave coupler for coupling said first and said second arm in such a manner so as to provide on said output of said first arm an output signal comprising said first range of frequencies when said first range of frequencies is applied to said first arm and said second range of frequencies when said second range of frequencies is applied to said second arm.

2. An apparatus according to claim 1 wherein said coupler comprises a parallel line coupler.

3. An apparatus according to claim 1 wherein said coupler comprises a contra-directional coupler.

4. An apparatus according to claim 3 wherein said coupler comprises a parallel line coupler.

5. An apparatus according to claim 1 wherein said coupler comprises a contra-directional coupler having a through-arm with an input port and an output port and a coupling arm having an adjacent port and an opposite port, said first arm comprises said through-arm and said input and said output of said first arm comprises said input port and said output port of said through-arm, respectively, said second arm comprises said coupling arm and said input and said output of said second arm comprises said adjacent port and said opposite port of said coupling arm, respectively, and said means for coupling comprises means for preferentially coupling more energy from said input port to said adjacent port than from said input port to said opposite port.

6. An apparatus according to claim 1 wherein said coupler comprises a tightly coupled forward coupling coupler.

7. An apparatus according to claim 4 wherein said coupler comprises a parallel line coupler.

8. An apparatus according to claim 1 wherein said coupler comprises a tightly coupled forward coupling coupler having a through-arm with an input port and an output port, and a coupling arm having an adjacent port and an opposite port, said first arm comprises said through-arm an said input and said output of said first arm comprises said input port and said output port of said through-arm, respectively, said second arm comprises said coupling arm and said input and said output of said second arm comprises said adjacent port and said opposite port of said coupling arm, respectively, and said coupling means comprises means for preferentially coupling more energy from said input port to said opposite port than from said input port to said adjacent port.

9. An apparatus according to claim 1 wherein said coupler comprises means for providing on said output of said first arm, in addition to a loss of signal strength due to insertion loss, said output signal having a maximum of approximately a 3 dB loss of signal strength with respect to said signals applied to each of said first and said second arms.

10. An apparatus according to claim 1 wherein said first range of frequencies generally comprises frequencies of less than 40 GHz and said second range of frequencies generally comprises frequencies greater than 40 GHz.

11. An apparatus according to claim 1 wherein said first means comprises a switching means for selectively coupling said input of said first arm to one of a plurality of signal sources providing signals having frequencies of less than 40 GHz.

12. An apparatus according to claim 11 wherein said switching means comprises a PIN diode switching means.

13. An apparatus for selectively providing first and second signals at a test signal port and a reference signal port, each of said signals having a first and second range of frequencies, respectively, said first range of frequencies comprising multiple decades of frequencies, comprising:
- a power splitter having an input and a first and a second output;
- a first coupler having a through-arm and a coupling arm, said through-arm of said first coupler having an input and an output and said coupling arm of said first coupler having an adjacent port and an opposite port;
- a second coupler having a through-arm and a coupling arm, said through-arm of said second coupler having an input and an output and said coupling arm of said second coupler having an adjacent port and an opposite port;
- a third coupler having a through-arm and a coupling arm, said through-arm of said third coupler having an input and an output and said coupling arm of said third coupler having an adjacent port and an opposite port;
- means for coupling a source of said signals having said first range of frequencies to said input of said power splitter;
- means for coupling said input and said output of said through-arm of said first coupler to said first output of said power splitter and said test signal port, respectively;
- means for coupling said input and said output of said through-arm of said second coupler to said second output of said power splitter and said reference signal port, respectively;
- means for coupling said input and said output of said through-arm of said third coupler to a source of said signals having said second range of frequencies and to said opposite port of said coupling arm of said first coupler, respectively; and
- means for coupling said opposite port of said second coupler to said adjacent port of said third coupler.

14. An apparatus according to claim 13 wherein said first and said second couplers provide, in addition to an insertion loss, a maximum loss of approximately 3 dB in signal strength for signals having a frequency of less than 40 GHz and a frequency of greater than 40 GHz applied to their through and coupling arms, respectively, and said third coupler provides, in addition to an insertion loss, a maximum loss of approximately 6 dB in signal strength for a signal having a frequency of greater than 40 GHz which is coupled to its coupling arm and a 1.5 dB loss in signal strength for a signal having a frequency greater than 40 GHz transmitted through its through-arm.

15. An apparatus according to claim 13 wherein said first and said second couplers comprise contra-directional microwave couplers.

16. An apparatus according to claim 13 wherein said first, said second and said third couplers comprise forward coupling microwave couplers.

17. A method of multiplexing first and second signals having a first and second range of frequencies, respectively, using a microwave coupler, said first range of frequencies comprising multiple decades of frequencies, said coupler having a first arm and a second arm, said first arm and said second arm each having an input and an output, said first arm being operative over a frequency band which substantially extends over said first range of frequencies, comprising the steps of:

selectively applying said first signals having said first range of frequencies to said input of said first arm;

selectively applying said second signals having said second range or frequencies to said input of said second arm; and coupling in said microwave coupler said first and said second arms in such a manner so as to provide on said output of said first arm an output signal comprising said first range of frequencies when said first range of frequencies is applied to said first arm and said second range of frequencies when said second range of frequencies is applied to said second arm.

18. A method according to claim 17 wherein said coupler comprises a parallel line coupler.

19. A method according to claim 17 wherein said coupler comprises a contra-directional coupler.

20. A method according to claim 19 wherein said coupler comprises a parallel line coupler.

21. A method according to claim 17 wherein said coupler comprises a contra-directional coupler having a through-arm with an input port and an output port and a coupling arm having an adjacent port and an opposite port, said first arm comprises said through-arm and said input and said output of said first arm comprises said input port and said output port of said through-arm, respectively, said second arm comprises said coupling arm and said input and said output of said second arm comprises said adjacent port and said opposite port of said coupling arm, respectively, and said coupling step comprises the step of preferentially coupling more energy from said input port to said adjacent port than from said input port to said opposite port.

22. A method according to claim 17 wherein said coupler comprises a tightly coupled forward coupling coupler.

23. A method according to claim 20 wherein said coupler comprises a parallel line coupler.

24. A method according to claim 17 wherein said coupler comprises a tightly coupled forward coupling coupler having a through-arm with an input port and an output port and a coupling arm having an adjacent port and an opposite port, said first arm comprises said through-arm and said input and said output of said first arm comprises said input port and said output port of said through-arm, respectively, said second arm comprises said coupling arm and said input and said output of said second arm comprises said adjacent port and said opposite port of said coupling arm, respectively, and said coupling step comprises the step of preferentially coupling more energy from said input port to said opposite port than from said input port to said adjacent port.

25. A method according to claim 17 wherein said step of coupling so as to provide on said output of said first arm an output signal comprises the step of providing on said output of said first arm, in addition to a loss of signal strength due to insertion loss, an output signal having a maximum of approximately a 3 dB loss of signal strength with respect to said signals applied to each of said first and said second arms.

26. A method according to claim 17 wherein said first range of frequencies generally comprises frequencies of less than 40 GHz and said second range of frequencies generally comprises frequencies greater than 40 GHz.

27. A method according to claim 17 wherein said step of applying signals having said first range of frequencies comprises the step of selectively coupling said input of said first arm to a plurality of signal sources providing signals having frequencies of less than 40 GHz.

28. A method according to claim 27 wherein said step of selectively coupling said input of said first arm to a plurality of signal sources comprises using a PIN diode switching means.

29. A method of selectively providing first and second signals at a test signal port and a reference signal port, respectively, each of said signals having a first and second range of frequencies, respectively, said first range of frequencies comprising multiple decades of frequencies, comprising the steps of:

providing a power splitter having an input and a first and a second output;

providing a first coupler having a through-arm and a coupling arm, said through-arm of said first coupler having an input and an output and said coupling arm of said first coupler having an adjacent port and an opposite port;

providing a second coupler having a through-arm and a coupling arm, said through-arm of said second coupler having an input and an output and said coupling arm of said second coupler having an adjacent port and an opposite port;

providing a third coupler having a through-arm and a coupling arm, said through-arm of said third coupler having an input and an output and said coupling arm of said third coupler having an adjacent port and an opposite port;

coupling a source of said signals having said first range of frequencies to said input of said power splitter;

coupling said input and said output of said through-arm of said first coupler to said first output of said power splitter and said test signal port, respectively;

coupling said input and said output of said through-arm of said second coupler to said second output of said power splitter and said reference signal port, respectively;

coupling said input and said output of said through-arm of said third coupler to a source of said signals having said second range of frequencies and to said opposite port of said coupling arm of said first coupler, respectively; and coupling said opposite port of said second coupler to said adjacent port of said third coupler.

30. A method according to claim 29 wherein said step of providing said first and said second couplers comprises the step of providing in said first and second couplers, in addition to an insertion loss, a maximum los of approximately 3 dB in signal strength for signals having a frequency of less than 40 GHz and a frequency of greater than 40 GHz applied to said through and coupling arms, respectively, of said first and second couplers and said step of providing said third coupler comprises the step of providing in said third coupler, in addition to an insertion loss, a maximum los of approximately 6 dB in signal strength for a signal having a frequency of greater than 40 GHz which is coupled to said coupling arm of said third coupler and a 1.5 dB loss in signal strength for a signal having a frequency greater than 40 GHz transmitted through said through-arm of said third coupler.

31. A method according to claim 29 wherein said first and said second couplers comprise contra-directional microwave couplers.

32. A method according to claim 29 wherein said first, said second and said third couplers comprise forward coupling microwave couplers.

* * * * *

UNITED STATES PATENT AND TRADEMARK OFFICE
CERTIFICATE OF CORRECTION

PATENT NO. : 5,053,733
DATED : October 1, 1991
INVENTOR(S) : WILLIAM W. OLDFIELD It is certified that error appears in the above-identified patent and that said Letters Patent is hereby corrected as shown below:

```
Column 4, line 6, before "multi-" insert --signal are--.
Column 5, line 1, after "0.01 GHz" and before the period (.)
                  insert --to 40 GHz--.
Column 6, line 20, before "signal" insert --greater--.
          line 45, before "described" insert --as--.
          line 46, change "couple" to --coupler--.
Column 7, line 10, change "82" to --86--.
Column 9, line 1, after "122_a," change "122" to --122_b--.
          line 20, after "second" change "stripline" to
                  --striplines--.
          line 21, delete "107_1,".
Column 10, line 36, change "40≥60 GHz" to --40-60 GHz--.
```

Signed and Sealed this

Second Day of March, 1993

*Attest:*

STEPHEN G. KUNIN

*Attesting Officer*   Acting Commissioner of Patents and Trademarks